United States Patent
Yoshikawa et al.

(10) Patent No.: US 9,666,922 B2
(45) Date of Patent: May 30, 2017

(54) DIELECTRIC FILTER, DUPLEXER, AND COMMUNICATION DEVICE

(71) Applicant: KYOCERA Corporation, Kyoto-shi, Kyoto (JP)

(72) Inventors: Hiromichi Yoshikawa, Kyoto (JP); Masafumi Horiuchi, Kyoto (JP); Katsuro Nakamata, Kyoto (JP)

(73) Assignee: Kyocera Corporation, Kyoto (JP)

( * ) Notice: Subject to any disclaimer, the term of this patent is extended or adjusted under 35 U.S.C. 154(b) by 26 days.

(21) Appl. No.: 14/767,456

(22) PCT Filed: Feb. 24, 2014

(86) PCT No.: PCT/JP2014/054302
§ 371 (c)(1),
(2) Date: Aug. 12, 2015

(87) PCT Pub. No.: WO2014/132914
PCT Pub. Date: Sep. 4, 2014

(65) Prior Publication Data
US 2015/0372364 A1  Dec. 24, 2015

(30) Foreign Application Priority Data

Feb. 26, 2013 (JP) ................................. 2013-036039
Feb. 26, 2013 (JP) ................................. 2013-036041
Feb. 27, 2013 (JP) ................................. 2013-037399

(51) Int. Cl.
*H01Q 1/00* (2006.01)
*H01P 1/20* (2006.01)
(Continued)

(52) U.S. Cl.
CPC .......... *H01P 1/2002* (2013.01); *H01P 1/2056* (2013.01); *H01P 7/04* (2013.01);
(Continued)

(58) Field of Classification Search
CPC .. H01Q 1/38; H01Q 5/10; H01Q 7/00; H01Q 9/04; H01Q 1/00
(Continued)

(56) References Cited

U.S. PATENT DOCUMENTS 4,450,421 A  5/1984  Meguro et al.
4,879,533 A  11/1989  De Muro et al.
(Continued)

FOREIGN PATENT DOCUMENTS

EP  2359966 A1  8/2011
JP  60-165102 A  8/1985
(Continued)

OTHER PUBLICATIONS

English Translation of JP-06-303004 A, (Fuji Electrochemical Co Ltd) Oct. 28, 1994 (Oct. 28, 1994).*
(Continued)

*Primary Examiner* — Huedung Mancuso
(74) *Attorney, Agent, or Firm* — Volpe and Koenig, P.C.

(57) ABSTRACT

There are provided a dielectric filter with excellent electrical characteristics, a duplexer, and a communication device using the dielectric filter. A dielectric filter includes a dielectric block provided with first through holes; inner conductors disposed on inner surfaces of the first through holes; second through holes; a terminal electrode connected to an inner conductor located at on end; a terminal electrode connected to an inner conductor located at the other end; and an outer conductor surrounding the dielectric block, being connected to a reference potential, wherein the first through holes are located on a second main surface side, and the second through holes are located on a first main surface side with respect to the first through holes. A duplexer and a communication device use this dielectric filter.

18 Claims, 5 Drawing Sheets

(51) Int. Cl.
*H01P 1/205* (2006.01)
*H01P 7/04* (2006.01)
*H01Q 1/50* (2006.01)
*H03H 7/46* (2006.01)
*H01P 1/213* (2006.01)

(52) U.S. Cl.
CPC ............ *H01Q 1/50* (2013.01); *H03H 7/463* (2013.01); *H01P 1/2136* (2013.01)

(58) Field of Classification Search
USPC .......................................... 343/700 MS, 905
See application file for complete search history.

(56) References Cited

U.S. PATENT DOCUMENTS

| | | | | |
|---|---|---|---|---|
| 5,010,309 | A * | 4/1991 | Manssen | H01P 1/2056 333/202 |
| 5,428,325 | A * | 6/1995 | Jachowski | H01P 1/2056 333/134 |
| 5,446,729 | A * | 8/1995 | Jachowski | H04J 1/08 333/1 |
| 6,806,791 | B1 * | 10/2004 | Wang | H01P 1/2138 333/134 |
| 7,861,398 | B1 * | 1/2011 | Mehta | H01P 1/2056 29/600 |
| 2001/0010507 | A1 * | 8/2001 | Hiroshima | H01P 1/2056 343/853 |
| 2009/0226269 | A1 | 9/2009 | Iyori et al. | |
| 2011/0070040 | A1 | 3/2011 | Park et al. | |
| 2011/0229279 | A1 | 9/2011 | Kobayashi | |
| 2013/0196608 | A1 | 8/2013 | Yoshikawa et al. | |

FOREIGN PATENT DOCUMENTS

| | | |
|---|---|---|
| JP | 1-101706 U | 7/1989 |
| JP | 01-291501 A | 11/1989 |
| JP | 05-175708 A | 7/1993 |
| JP | 06-303004 A | 10/1994 |
| JP | 2000-084707 A | 3/2000 |
| JP | 2001-047306 A | 2/2001 |
| JP | 2009-208216 A | 9/2009 |
| JP | 2010-532271 A | 10/2010 |
| WO | 2009/005218 A1 | 1/2009 |
| WO | 2010/058856 A1 | 5/2010 |
| WO | 2012/043739 A1 | 4/2012 |

OTHER PUBLICATIONS

International Search Report, PCT/JP2014/054443, Mar. 25, 2014, 2 pgs.
International Search Report, PCT/JP2014/054302, May 20, 2014, 2 pgs.
Extended European Search Report, European Patent Application No. 14756716.8, Sep. 9, 2016, 10 pgs.

* cited by examiner

DIELECTRIC FILTER, DUPLEXER, AND COMMUNICATION DEVICE

TECHNICAL FIELD

The present invention relates to a dielectric filter, a duplexer, and a communication device with excellent electrical characteristics.

BACKGROUND ART

There is known a dielectric filter configured by inner conductors respectively disposed on inner surfaces of a plurality of through holes formed in a dielectric block and an outer conductor surrounding the dielectric block (for example, see Patent Literature 1).

CITATION LIST

Patent Literature

Patent Literature 1: WO2012/043739A1

SUMMARY OF INVENTION

Technical Problem

However, in the related art dielectric filter proposed in Patent Literature 1, for example, it is difficult to strengthen capacitance coupling of adjacent inner conductors, and particularly, it is difficult to sufficiently secure the amount of attenuation outside a passband. Thus, it is difficult to obtain excellent electrical characteristics.

The invention is devised in view of such problems in the conventional art, and an object thereof is to provide a dielectric filter with excellent electrical characteristics, a duplexer, and a communication device using the dielectric filter.

Solution to Problem

A dielectric filter according to an aspect of the invention includes: a dielectric block having a rectangular parallelepiped shape, being provided with a plurality of first through holes and one or more second through holes; a plurality of inner conductors disposed on inner surfaces of the first through holes, respectively, including a first inner conductor and a second inner conductor; a first terminal electrode electrically or electromagnetically connected to the first inner conductor; a second terminal electrode electrically or electromagnetically connected to the second inner conductor; and an outer conductor disposed to surround the dielectric block, being connected to a reference potential, the first through holes penetrating into the dielectric block in a first direction which is a direction from one of a first side surface and a second side surface of the dielectric block which face each other, toward the other thereof, and being arranged at intervals in a second direction which is a direction from one of a third side surface and a fourth side surface of the dielectric block which face each other, toward the other thereof, the one or more second through holes penetrating into the dielectric block in the first direction, and being located at a position between adjacent first through holes in the second direction, the first inner conductor being disposed on an inner surface of a first through hole of the first through holes which is located at one end in the second direction of the dielectric block, the second inner conductor being disposed on an inner surface of a first through hole of the first through holes which is located at the other end in the second direction of the dielectric block, the outer conductor being disposed to be in contact with a first main surface of the dielectric block, and to face a second main surface, the third side surface, and the fourth side surface of the dielectric block at intervals, the first through holes being located on a second main surface side of the dielectric block, the second through holes being located on a first main surface side with reference to the first through holes.

A duplexer according to another aspect of the invention includes at least: an antenna terminal; a transmitting terminal; a receiving terminal; a transmitting filter connected in series between the antenna terminal and the transmitting terminal; and a receiving filter connected in series between the antenna terminal and the receiving terminal, at least one of the transmitting filter and the receiving filter being the above-described dielectric filter.

A radio communication device according to still another aspect of the invention including at least: the above-described duplexer; an antenna connected to the antenna terminal in a direct manner or through another circuit; a transmitting circuit connected to the transmitting terminal in a direct manner or through another circuit; and a receiving circuit connected to the receiving terminal in a direct manner or through another circuit.

Advantageous Effects of Invention

According to the dielectric filter of the invention, it is possible to obtain a dielectric filter with excellent electrical characteristics. According to the duplexer of the invention, it is possible to obtain a duplexer with excellent electrical characteristics. According to the communication device of the invention, it is possible to obtain a communication device with excellent communication quality.

DESCRIPTION OF EMBODIMENTS

Hereinafter, a dielectric filter, a dielectric filter, and a duplexer and a communication device using the dielectric filter will be described in detail with reference to the accompanying drawings.

First Embodiment

Figure 1:
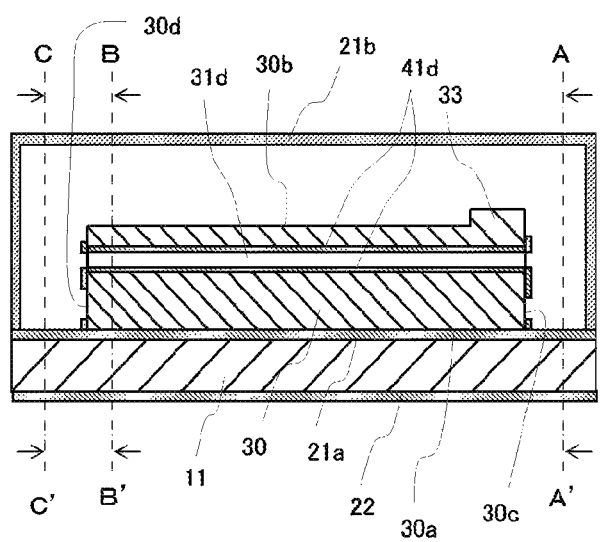
FIG. 1 is a sectional view schematically illustrating a dielectric filter according to a first embodiment of the invention.
Figure 1:
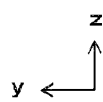
Figure 2:
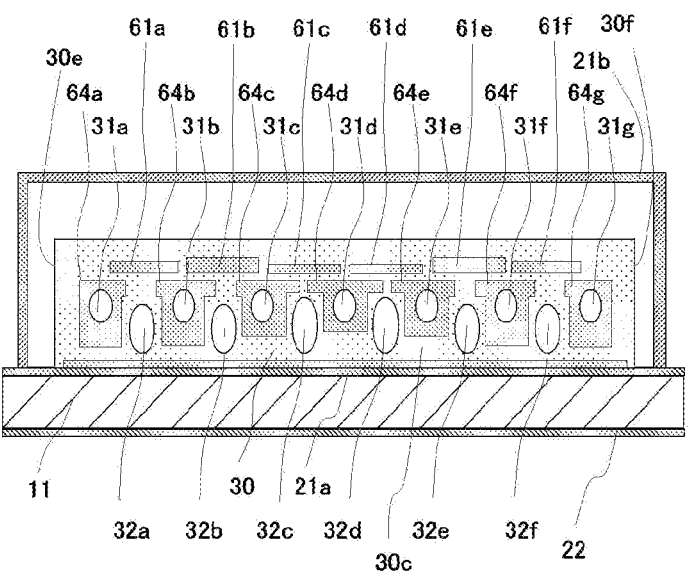
FIG. 2 is a sectional view schematically illustrating a dielectric filter according to a first embodiment of the invention.
Figure 2:
Figure 3:
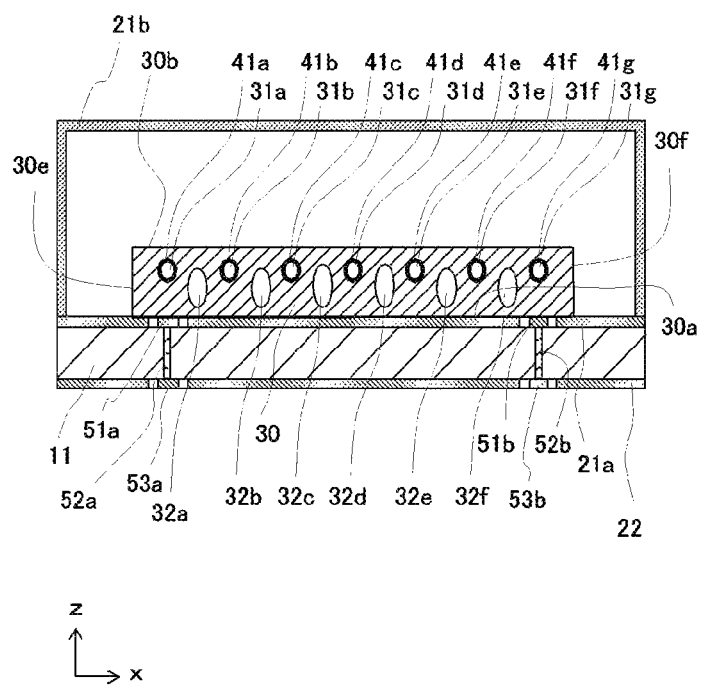
FIG. 3 is a sectional view schematically illustrating a dielectric filter according to a first embodiment of the invention.
Figure 4:
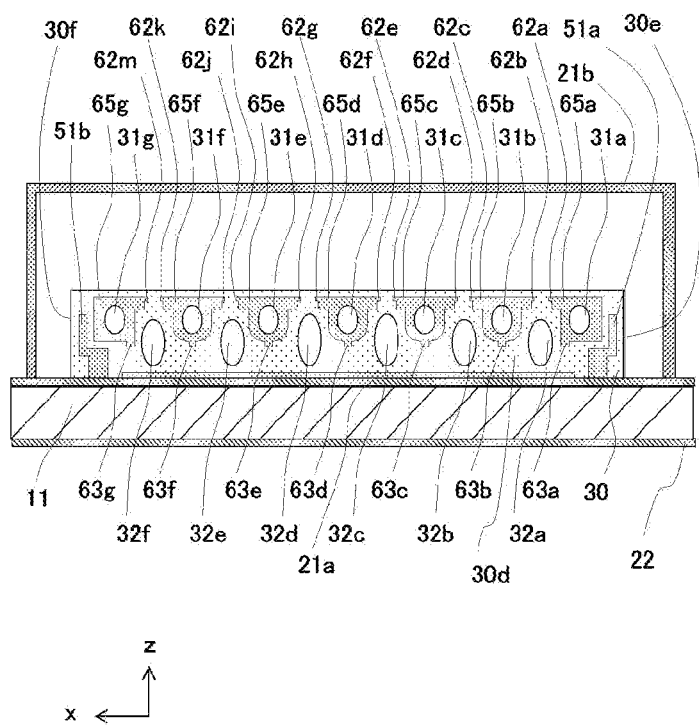
FIG. 4 is a sectional view schematically illustrating a dielectric filter according to a first embodiment of the invention.

FIG. 1 is a sectional view schematically illustrating a dielectric filter according to a first embodiment of the invention. FIG. 2 is a diagram illustrating the dielectric filter in FIG. 1 taken along line A-A', seen in an arrow direction (+y direction in the figure). FIG. 3 is a diagram illustrating the dielectric filter in FIG. 1 taken along line B-B', seen in an arrow direction (+y direction in the figure). FIG. 4 is a diagram illustrating the dielectric filter in FIG. 1 taken along line C-C', seen in an arrow direction (−y direction in the figure).

As shown in FIGS. 1 to 4, the dielectric filter according to the present embodiment includes a dielectric block 30, first through holes 31a to 31g (first through hole 31a, first through hole 31b, first through hole 31c, first through hole 31d, first through hole 31e, first through hole 31f, and first through hole 31g), second through holes 32a to 32f (second through hole 32a, second through hole 32b, second through hole 32c, second through hole 32d, second through hole 32e, and second through hole 32f), inner conductors 41a to 41g (inner conductor 41a, inner conductor 41b, inner conductor 41c, inner conductor 41d, inner conductor 41e, inner conductor 41f, and inner conductor 41g), first conductors 61a to 61f (first conductor 61a, first conductor 61b, first conductor 61c, first conductor 61d, first conductor 61e, and first conductor 61f), second conductors 62a to 62m (second conductor 62a, second conductor 62b, second conductor 62c, second conductor 62d, second conductor 62e, second conductor 62f, second conductor 62g, second conductor 62h, second conductor 62i, second conductor 62j, second conductor 62k, and second conductor 62m), third conductors 63a to 63g (third conductor 63a, third conductor 63b, third conductor 63c, third conductor 63d, third conductor 63e, third conductor 63f, and third conductor 63g), fourth conductors 64a to 64g (fourth conductor 64a, fourth conductor 64b, a fourth conductor 64c, fourth conductor 64d, fourth conductor 64e, fourth conductor 64f, and fourth conductor 64g), fifth conductors 65a to 65g (fifth conductor 65a, fifth conductor 65b, fifth conductor 65c, fifth conductor 65d, fifth conductor 65e, fifth conductor 65f, and fifth conductor 65g), terminal electrodes 51a and 51b (terminal electrode 51a and terminal electrode 51b), outer conductors 21a and 21b (outer conductor 21a and outer conductor 21b), a dielectric substrate 11, a conductor 22, via conductors 52a and 52b (via conductor 52a and via conductor 52b), and outer electrodes 53a and 53b (outer conductor 53a and outer conductor 53b).

The dielectric block 30 is a rectangular parallelepiped dielectric, and includes the first through holes 31a to 31g and the second through holes 32a to 32f. Each of the first through holes 31a to 31g penetrates in a y-axis direction in the figures which is a direction from one of a first side surface 30c and a second side surface 30d of the dielectric block 30 which face each other toward the other thereof. Further, the first through holes 31a to 31g are arranged at intervals in an x-axis direction in the figures which is a direction from one of a third side surface 30e and a fourth side surface 30f of the dielectric block 30 which face each other toward the other thereof. That is, the first through holes 31a to 31g are arranged in the order of 31a, 31b, 31c, 31d, 31e, 31f, and 31g from the third side surface 30e toward the fourth side surface 30f of the dielectric block 30.

On inner surfaces of the respective first through holes 31a to 31g, the inner conductors 41a to 41g are disposed over the entire length thereof. That is, the inner conductor 41a is disposed on the inner surface of the first through hole 31a, the inner conductor 41b is disposed on the inner surface of the first through hole 31b, the inner conductor 41c is disposed on the inner surface of the first through hole 31c, the inner conductor 41d is disposed on the inner surface of the first through hole 31d, the inner conductor 41e is disposed on the inner surface of the first through hole 31e, the inner conductor 41f is disposed on the inner surface of the first through hole 31f, and the inner conductor 41g is disposed on the inner surface of the first through hole 31g.

The fourth conductors 64a to 64g are respectively disposed around the first through holes 31a to 31g of the dielectric block 30 on the first side surface 30c. That is, the fourth conductor 64a is disposed around the first through hole 31a, the fourth conductor 64b is disposed around the first through hole 31b, the fourth conductor 64c is disposed around the first through hole 31c, the fourth conductor 64d is disposed around the first through hole 31d, the fourth conductor 64e is disposed around the first through hole 31e, the fourth conductor 64f is disposed around the first through hole 31f, and the fourth conductor 64g is disposed around the first through hole 31g.

Further, the fifth conductors 65a to 65g are respectively disposed around the first through holes 31a to 31g of the dielectric block 30 on the second side surface 30d. That is, the fifth conductor 65a is disposed around the first through hole 31a, the fifth conductor 65b is disposed around the first through hole 31b, the fifth conductor 65c is disposed around the first through hole 31c, the fifth conductor 65d is disposed around the first through hole 31d, the fifth conductor 65e is disposed around the first through hole 31e, the fifth conductor 65f is disposed around the first through hole 31f, and the fifth conductor 65g is disposed around the first through hole 31g.

Further, the fourth conductors 64a to 64g and the fifth conductors 65a to 65g are connected respectively to the inner conductors 41a to 41g corresponding thereto. That is, the fourth conductor 64a and the fifth conductor 65a are connected to the inner conductor 41a, the fourth conductor 64b and the fifth conductor 65b are connected to the inner conductor 41b, the fourth conductor 64c and the fifth conductor 65c are connected to the inner conductor 41c, the fourth conductor 64d and the fifth conductor 65d are connected to the inner conductor 41d, the fourth conductor 64e and the fifth conductor 65e are connected to the inner conductor 41e, the fourth conductor 64f and the fifth conductor 65f are connected to the inner conductor 41f, and the fourth conductor 64g and the fifth conductor 65g are connected to the inner conductor 41g. Due to the fourth conductors 64a to 64g and the fifth conductors 65a to 65g, it is possible to increase electrostatic capacitance between adjacent inner conductors and electrostatic capacitance between the inner conductors 41a to 41g and the outer conductors 21a and 21b.

In the vicinity of the inner conductor 41a located in an end portion in the x-axis direction in the figures, the terminal electrode 51a is disposed in a region ranging from a first main surface 30a to a second side surface 30d in the dielectric block 30. The terminal electrode 51a is disposed so that a part thereof faces the inner conductor 41a through the dielectric block 30, and is electromagnetically connected to the inner conductor 41a. Further, in the vicinity of the inner conductor 41g located in the other end portion in the x-axis direction in the figures, the terminal electrode 51b is disposed in a region ranging from the first main surface 30a to the second side surface 30d in the dielectric block 30. The terminal electrode 51b is disposed so that a part thereof faces the inner conductor 41g through the dielectric block 30, and is electromagnetically connected to the inner conductor 41g. The terminal electrode 51a may be electrically connected to the inner conductor 41a (so that a direct current can flow), and the terminal electrode 51b may be electrically connected to the inner conductor 41g (so that a direct current can flow).

The dielectric substrate 11 is a plate-shaped dielectric. The outer conductor 21a is disposed on an upper surface of the dielectric substrate 11, and the conductor 22 is disposed on a lower surface thereof. The outer conductor 21a and the conductor 22 are sheet-shaped conductors, and are connected to a reference potential. Further, the dielectric block 30 is disposed on the outer conductor 21a so that the first main surface 30a is in contact with a first main surface (upper surface) of the outer conductor 21a.

The outer conductor 21b is a rectangular parallelepiped box-shaped conductor of which one surface is opened, in which the opening is directed toward the outer conductor 21a. Further, the outer conductor 21b is disposed on the first main surface of the outer conductor 21a to be connected to the outer conductor 21a so that the dielectric block 30 is accommodated therein. The outer conductor 21b is disposed to face the second main surface 30b, the first side surface 30c, the second side surface 30d, the third side surface 30e, and the fourth side surface 30f of the dielectric block 30 at intervals, and a space between the dielectric block 30 and the outer conductor 21b is filled with air.

Further, the terminal electrode 51a is connected to the external electrode 53a disposed on a lower surface of the dielectric substrate 11 through the via conductor 52a that passes through the dielectric substrate 11. Further, the terminal electrode 51b is connected to the external electrode 53b disposed on the lower surface of the dielectric substrate 11 through the via conductor 52b that passes through the dielectric substrate 11. The outer conductor 21a is formed in a region spaced apart from the terminal electrodes 51a and 51b on the upper surfaces of the dielectric substrate 11 so as not to be in contact with the terminal electrodes 51a and 51b. Further, the conductor 22 is formed in a region spaced apart from the external electrode 53a and the external electrode 53b on the lower surface of the dielectric substrate 11 so as not to be in contact with the outer electrode 53a and outer electrode 53b.

The outer conductors 21a and 21b are connected to the reference potential to function as an outer conductor of the dielectric filter. Further, seven coaxial resonators are configured by the inner conductors 41a to 41g and the outer conductors 21a and 21b that surround the inner conductors 41a to 41g at intervals, and the inner conductors 41a to 41g and the outer conductors 21a and 21b are electromagnetically coupled with each other to form the dielectric filter.

In the dielectric filter according to the present embodiment with such a configuration, for example, if an electric signal is inputted to the terminal electrode 51a through the external electrode 53a and the via conductor 52a, the seven coaxial resonators composed of the inner conductors 41a to 41g and the outer conductors 21a and 21b resonate, and an electric signal is outputted from the terminal electrode 51b through the via conductor 52b and the external electrode 53b. Here, since signals having frequency bandwidths including resonance frequencies of the plural coaxial resonators are selectively outputted, the dielectric filter functions as a band-pass filter.

In this way, the dielectric filter according to the present embodiment includes the dielectric block 30, the plurality of inner conductors 41a to 41g, the terminal electrode 51a, the terminal electrode 51b, and the outer conductors 21a and 21b. The dielectric block 30 is a rectangular parallelepiped dielectric, and includes the plurality of first through holes 31a to 31g, and one or more second through holes 32a to 32f. The plurality of inner conductors 41a to 41g are respectively disposed on the inner surfaces of the first through holes 31a to 31g, and include the inner conductor 41a and the inner conductor 41g. The terminal electrode 51a is electrically or electromagnetically connected to the inner conductor 41a. The terminal electrode 51b is electrically or electromagnetically connected to the inner conductor 41g. The outer conductors 21a and 21b are disposed to surround the dielectric block 30, and are connected to the reference potential. The first through holes 31a to 31g penetrate in the first direction (y-axis direction) which is the direction from one of the first side surface 30c and the second side surface 30d that face each other in the dielectric block 30 toward the other thereof. Further, the first through holes 31a to 31g are arranged at intervals in the second direction (x-axis direction) which is the direction from one of the third side surface 30e and the fourth side surface 30f that face each other in the dielectric block 30 toward the other thereof. The second through holes 32a to 32f penetrate in the first direction (y-axis direction). Further, one or more second through holes 32a to 32f are located between adjacent first through holes among the first through holes 31a to 31g in the second direction (x-axis direction). The inner conductor 41a is disposed on the inner surface of the first through hole 31a located at one end in the second direction (−x directional side end portion) of the dielectric block. The inner conductor 41g is disposed on the inner surface of the first through hole 31g located at the other end in the second direction (+x directional side end portion) of the dielectric block. The outer conductors 21a and 21b are disposed to be in contact with the first main surface 30a of the dielectric block 30, and are disposed to face the second main surface 30b, the third side surface 30e, and the fourth side surface 30f of the dielectric block 30 at intervals. The first through holes 31a to 31g are disposed on a second main surface 30b side of the dielectric block 30, and the second through holes 32a to 32f are disposed on a first main surface 30a side with reference to the first through holes 31a to 31g.

The dielectric filter according to the present embodiment is disposed so that the outer conductor 21b that functions as a part of the outer conductor of the coaxial resonators faces the third side surface 30e, the fourth side surface 30f, and the second main surface 30b of the dielectric block 30 at intervals. Thus, it is possible to achieve a low loss filter characteristic.

Further, in the dielectric filter according to the present embodiment, the outer conductor 21b is disposed to face the second main surface 30b, the first side surface 30c, the second side surface 30d, the third side surface 30e, and the fourth side surface 30f of the dielectric block 30 at intervals, and the space between the dielectric block 30 and the outer conductor 21b is filled with air. Thus, it is possible to increase a difference between a resonance frequency in a first resonance mode and a resonance frequency in a cavity mode which is a spurious mode, and thus, it is possible to increase the amount of attenuation outside a passband.

Further, in the dielectric filter according to the present embodiment, the first through holes 31a to 31g are arranged on the second main surface 30b side of the dielectric block 30. Thus, since the inner conductors 41a to 41g are arranged closer to the second main surface 30b of the dielectric block 30, compared with a case where the inner conductors 41a to 41g are present at the center between the first main surface 30a and the second main surface 30b, it is possible to further increase a Q value in the first resonance mode. Here, "the first through holes 31a to 31g are arranged on the second main surface 30b side of the dielectric block 30" means that the center of gravity of each of the first through holes 31a to 31g is disposed on the second main surface 30b side (+z direction side) with reference to the center of the dielectric block 30 in the direction (z-axis direction) from one of the first main surface 30a and the second main surface 30b toward the other thereof.

It is preferable that an interval between the second main surface 30b of the dielectric block 30 and the outer conductor 21b and intervals between the third side surface 30e and the fourth side surface 30f that face each other and the outer conductor 21b are large to enhance electrical characteristics, but if the intervals are too large, the dielectric filter becomes too large. Thus, the intervals may be appropriately set according to necessary electrical characteristics and allowed dimensions of the dielectric filter.

Further, the dielectric filter according to the present embodiment includes the first conductors 61a to 61f arranged on the first side surface 30c of the dielectric block 30 in order to increase electrostatic capacitances between internal conductors that are not adjacent to each other among the internal conductors 41a to 41g. The first conductors 61a to 61f are arranged in a line in the x-axis direction in the figures, and are arranged so that opposite ends thereof in the x-axis direction in the figures are close to adjacent inner conductors. Further, each of the first conductors 61a to 61f is disposed so that electrostatic capacitances are formed between the first conductor and both of the adjacent inner conductors. Further, the first conductors 61a to 61f are arranged so that electrostatic capacitances are formed between adjacent conductor patterns among the first conductors 61a to 61f.

That is, the first conductors 61a to 61b are arranged to be close to each other, and electrostatic capacitance is formed therebetween. Further, the first conductor 61a is disposed to be also close to the fourth conductor 64a connected to the inner conductor 41a, so that electrostatic capacitance is also formed between the first conductor 61a and the inner conductor 41a. Further, the first conductor 61b is disposed to be also close to the fourth conductor 64c connected to the inner conductor 41c, so that electrostatic capacitance is also formed between the first conductor 61b and the inner conductor 41c. In this way, electrostatic capacitance is formed between the inner conductors 41a and 41c through the first conductors 61a and 61b, and the electrostatic capacitance between the inner conductors 41a and 41c increases by the first conductors 61a and 61b. Similarly, electrostatic capacitance between the inner conductors 41b and 41d increases by the first conductors 61b and 61c, electrostatic capacitance between the inner conductors 41c and 41e increases by the first conductors 61c and 61d, electrostatic capacitance between the inner conductors 41d and 41f increases by the first conductors 61d and 61e, and electrostatic capacitance between the inner conductors 41e and 41g increases by the first conductors 61e and 61f. It is sufficient if the number of conductive patterns for increasing electrostatic capacitance between inner conductors that are not adjacent to each other is at least one with respect to one set of inner conductors that are not adjacent to each other. That is, at least one conductive pattern may be used.

Further, the first conductors 61a to 61f are disposed on the second main surface 30b side with reference to the inner conductors 41a to 41g. That is, the centers of the first conductors 61a to 61f in the z-axis direction in the figures are disposed to be positioned on the second main surface 30b side (+z direction side in the figures) with reference to the centers of the inner conductors 41a to 41g in the z-axis direction in the figures. Thus, compared with a case where the first conductors 61a to 61f are disposed on the first main surface 30a side with reference to the inner conductors 41a to 41g, it is possible to increase electrostatic capacitance between inner conductors which are not adjacent to each other.

At first, the present inventors did not know the reason why such a phenomenon occurred, but reviewed it and reached the following conclusion. That is, as the inner conductors 41a to 41g are located on the second main surface 30b side, the strength of the electric field on the second main surface 30b side with reference to the inner conductors 41a to 41g is larger than the strength of the electric field on the first main surface 30a side with reference to the inner conductors 41a to 41g, in the dielectric block 30.

Further, the dielectric filter according to the present embodiment includes a protruding portion 33 that protrudes in the +z direction in the figures in an end in the −y direction (end on the first side surface 30c side) in the figures on the second main surface 30b of the dielectric block 30. Further, thus, a length in the direction from the first main surface 30a toward the second main surface 30b of the end on the first side surface 30c side of the dielectric block 30 is longer than a length in the direction from the first main surface 30a toward the second main surface 30b of the dielectric block 30 except the end on the first side surface 30c side of the dielectric block 30. Thus, compared with an end on the second side surface 30d side of the dielectric block 30, it is possible to increase the strength of the electric field in the end on the first side surface 30c side in which the first conductors 61a to 61f are formed. Thus, it is possible to further increase electrostatic capacitance formed between the inner conductors 41 which are not adjacent to each other through the first conductors 61a to 61f.

Further, the dielectric filter according to the present embodiment includes the second conductors 62a to 62m for adjusting electrostatic capacitance between inner conductors which are adjacent to each other among the inner conductors 41a to 41g. The fifth conductor 65a is connected to the inner conductor 41a, and the fifth conductor 65b is connected to the inner conductor 41b. Further, the second conductor 62a that protrudes toward the fifth conductor 65b is connected to a portion of the fifth conductor 65a that is close to the fifth conductor 65b, and the second conductor 62b that protrudes toward the fifth conductor 65a is connected to a portion of the fifth conductor 65b that is close to the fifth conductor 65a. That is, the second conductor 62a is electrically connected to the inner conductor 41a, and has a shape that protrudes toward the inner conductor 41b that is adjacent to the inner conductor 41a or a conductor (in this case, the fifth conductor 65b) that is electrically connected to the inner conductor 41b. The second conductor 62b is electrically connected to the inner conductor 41b, and has a shape that protrudes toward the inner conductor 41a that is adjacent to the inner conductor 41b or a conductor (in this case, the fifth conductor 65a) that is electrically connected to the inner conductor 41a. Thus, by trimming the second conductor 62a or the second conductor 62b, it is possible to adjust the electrostatic capacitance between the adjacent inner conductors 41a and 41b.

As shown in FIG. 4, while providing the same configurations and functions as in the second conductors 62a and 62b with respect to the adjacent inner conductors 41a and 41b, the second conductors 62c and 62d are provided with respect to the adjacent inner conductors 41b and 41c, the second conductors 62e and 62f are provided with respect to the adjacent inner conductors 41c and 41d, the second conductors 62g and 62h are provided with respect to the adjacent inner conductors 41d and 41e, the second conductors 62i and 62j are provided with respect to the adjacent inner conductors 41e and 41f, and the second conductors 62k and 62m are provided with respect to the adjacent inner conductors 41f and 41g.

Accordingly, it is possible to adjust the electrostatic capacitance between the inner conductors 41b and 41c by trimming the second conductors 62c and 62d. It is possible to adjust the electrostatic capacitance between the inner conductors 41c and 41d by trimming the second conductors 62e and 62f. It is possible to adjust the electrostatic capacitance between the inner conductors 41d and 41e by trimming the second conductors 62g and 62h. It is possible to adjust the electrostatic capacitance between the inner conductors 41e and 41f by trimming the second conductors 62i and 62j. It is possible to adjust the electrostatic capacitance between the inner conductors 41f and 41g by trimming the second conductors 62k and 62m. Here, it is sufficient if the number of the second conductors 62 is at least one with respect to one set of inner conductors that are adjacent to each other. That is, at least one second conductor may be used.

Further, the second conductors 62a to 62m for adjusting the electrostatic capacitance between adjacent inner conductors among the inner conductors 41a to 41g are disposed on the second side surface 30d of the dielectric block 30. Thus, compared with a case where the second conductors 62a to 62m are disposed on the first side surface 30c, it is possible to finely adjust the electrostatic capacitance between adjacent inner conductors. The present inventors reviewed the reason of such an effect, and reached the following conclusion. That is, it is estimated that this effect is obtained since the strength of the electric field in the side end portion of the second side surface 30d is smaller than the strength of the electric field in the side end portion of the first side surface 30c in which the strength of the electric field is large due to the formation of the protruding portion 33.

Further, the dielectric filter according to the present embodiment includes the third conductors 63a to 63g for adjusting electrostatic capacitances between the inner conductors 41a to 41g and the outer conductors 21a and 21b. The fifth conductor 65a is connected to the inner conductor 41a, and the third conductor 63a that protrudes toward the outer conductor 21a is connected to a portion of the fifth conductor 65a that is close to the outer conductor 21a. That is, the third conductor 63a is electrically connected to the inner conductor 41a, and has a shape that protrudes toward the outer conductors 21a and 21b. Accordingly, by trimming the third conductor 63a, it is possible to adjust the electrostatic capacitance between the inner conductor 41a and the outer conductor 21a.

As shown in FIG. 4, while providing the same configuration and function as in the third conductor 63a with respect to the inner conductor 41a, the third conductor 63b is provided with respect to the inner conductor 41b, the third conductor 63c is provided with respect to the inner conductor 41c, the third conductor 63d is provided with respect to the inner conductor 41d, and the third conductor 63e is provided with respect to the inner conductor 41e, and the third conductor 63f is provided with respect to the inner conductor 41f, and the third conductor 63g is provided with respect to the inner conductor 41g.

Accordingly, it is possible to adjust the electrostatic capacitance between the inner conductor 41b and the outer conductor 21a by trimming the third conductor 63b. It is possible to adjust the electrostatic capacitance between the inner conductor 41c and the outer conductor 21a by trimming the third conductor 63c. It is possible to adjust the electrostatic capacitance between the inner conductor 41d and the outer conductor 21a by trimming the third conductor 63d. It is possible to adjust the electrostatic capacitance between the inner conductor 41e and the outer conductor 21a by trimming the third conductor 63e. It is possible to adjust the electrostatic capacitance between the inner conductor 41f and the outer conductor 21a by trimming the third conductor 63f. It is possible to adjust the electrostatic capacitance between the inner conductor 41g and the outer conductor 21a by trimming the third conductor 63g. It is sufficient if the number of conductive patterns for adjusting electrostatic capacitances between the inner conductors and the outer conductors 21a and 21b is at least one with respect to one inner conductor, and thus, since it is not necessary that all of the inner conductors have the conductive patterns, at least one conductive pattern may be used.

Further, the third conductors 63a to 63g for adjusting the electrostatic capacitances between the inner conductors 41a to 41g and the outer conductors 21a and 21b are disposed on the second side surface 30d of the dielectric block 30. Thus, compared with a case where the third conductors 63a to 63g are disposed on the first side surface 30c, it is possible to finely adjust the electrostatic capacitances between the inner conductors 41a to 41g and the outer conductors 21a and 21b. The present inventors reviewed the reason of such an effect, and reached the following conclusion. That is, it is estimated that this effect is obtained since the strength of the electric field in the side end portion of the second side surface 30d is smaller than the strength of the electric field in the side end portion of the first side surface 30c in which the strength of the electric field is large due to the formation of the protruding portion 33.

Further, the dielectric filter according to the present embodiment includes the second through holes 32a to 32f. The second through holes 32a to 32f penetrate in the first direction (y-axis direction). Further, each one of the second through holes 32a to 32f is disposed between the first through holes that are adjacent to each other among the first through holes 31a to 31g, in the second direction (x-axis direction). That is, the second through hole 32a is disposed between the inner conductors 41a and 41b, the second through hole 32b is disposed between the inner conductors 41b and 41c, the second through hole 32c is disposed between the inner conductors 41c and 41d, the second through hole 32d is disposed between the inner conductors 41d and 41e, the second through hole 32e is disposed between the inner conductors 41e and 41f, and the second through hole 32f is disposed between the inner conductors 41f and 41g.

Through the second through holes 32a to 32f, it is possible to reduce effective dielectric constants between the inner conductors 41a to 41g and the outer conductors 21a and 21b. Thus, compared with a case where the second through holes 32a to 32f are not provided, it is possible to increase the Q value in the first resonance mode, and to obtain a dielectric filter with low loss. Further, through the second through holes 32a to 32f, it is possible to reduce an effective dielectric constant of a region surrounded by the outer conductors 21a and 21b. Thus, compared with a case where the second through holes 32a to 32f are not provided, it is possible to increase the difference between the resonance frequency in the first resonance mode and the resonance frequency in the cavity mode which is the spurious mode, and thus, it is possible to increase the amount of attenuation outside the passband. It is sufficient if the number of the second through holes 32a to 32f is at least one between adjacent inner conductors, and since it is not essential that the second through holes 32a to 32f are present between all the inner conductors, at least one through hole may be used.

Further, the first through holes 31a to 31g are located on the second main surface 30b side of the dielectric block 30, the second through holes 32a to 32f are located on the first main surface 30a side with reference to the first through holes 31a to 31g. Thus, compared with a case where the second through holes 32a to 32f are present on the second main surface 30b side with reference to the first through holes 31a to 31g, or a case where slits are formed instead of the second through holes 32a to 32f, it is possible to increase electrostatic capacitance between the inner conductors 41 that are adjacent to each other. Here, "the second through holes 32a to 32f are located on the first main surface 30a side with reference to the first through holes 31a to 31g" means that the center of gravity of each of the second through holes 32a to 32g is located on the first main surface 30a side (−z direction side) with reference to the center of gravity of each of the first through holes 31a to 31g in the direction (z-axis direction) from one of the first main surface 30a and the second main surface 30b toward the other thereof.

Further, in the dielectric filter according to the present embodiment, the volume of the second through holes 32c and 32d located at the center in the x-axis direction is larger than the volume of the through holes 32a and 32f located in opposite end portions in the x-axis direction. Thus, it is possible to more effectively increase the difference between the resonance frequency in the first resonance mode and the resonance frequency in the cavity mode which is the spurious mode, and to increase the amount of attenuation outside the passband. It is considered that such an effect is obtained since the strength of the electric field in the cavity mode is larger at the center than in the opposite end portions in the x-axis direction in the figures. In order to achieve this effect, it is sufficient that four or more first through holes 31 are provided and three or more second through holes 32 are disposed at intervals in the x-axis direction in the figures.

Here, the second through holes 32 located at the center in the x-axis direction represent the second through holes 32 located at positions that are the closest to the center of the dielectric block 30 in the x-axis direction. In the case of the present embodiment, the center of the dielectric block 30 in the x-axis direction is located at the center between the second through holes 32c and 32d, and both of the second through holes 32c and 32d correspond to the second through holes 32 located at the center in the x-axis direction.

Further, if volumes of the second through holes 32a to 32f gradually increase from the opposite end portions in the x-axis direction in the figures toward the central portion, it is possible to more effectively increase the difference between the resonance frequency in the first resonance mode and the resonance frequency in the cavity mode which is the spurious mode, and to increase the amount of attenuation outside the passband. It is considered that such an effect is obtained since strengths of the electric field in the cavity mode gradually increase from the opposite end portions toward the central portion in the x-axis direction in the figures.

Further, in the dielectric filter according to the present embodiment, the area of the fourth conductor 64d located at the center in the x-axis direction in the figures is smaller than the area of the fourth conductors 64a and 64g located in the opposite end portions in the x-axis direction. Accordingly, it is possible to more effectively increase the difference between the resonance frequency in the first resonance mode and the resonance frequency in the cavity mode which is the spurious mode, and to increase the amount of attenuation outside the passband.

In the dielectric filter according to the present embodiment, as a material of the dielectric block 30, various known dielectric materials such as resin such as epoxy resin or ceramics such as dielectric ceramics may be used. For example, dielectric ceramics containing $BaTiO_3$, $Pb_4Fe_2Nb_2O_{12}$, $TiO_2$, or the like may be preferably used. Further, as materials of various electrodes and conductors, various known conductive materials may be used. For example, a conductive material using Ag or Ag alloy such as Ag—Pd or Ag—Pt as a main ingredient, a Cu-based conductive material, a W-based conductive material, an Mo-based conductive material, a Pd-based conductive material, or the like may be preferably used. The thicknesses of various electrodes and conductors are set to 0.001 mm to 0.2 mm, for example.

Second Embodiment

Figure 5:
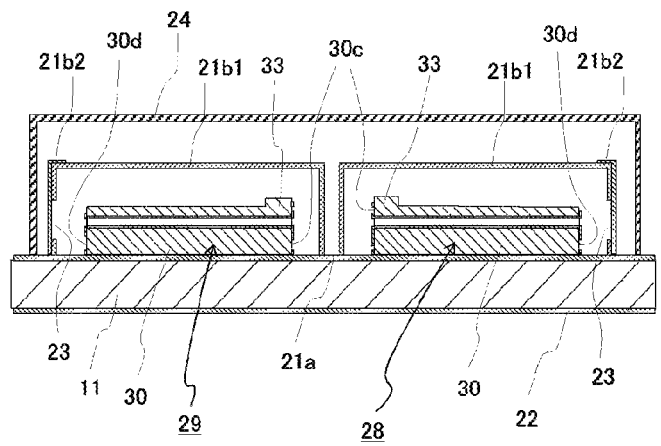
FIG. 5 is a sectional view schematically illustrating a duplexer according to a second embodiment of the invention.
Figure 6:
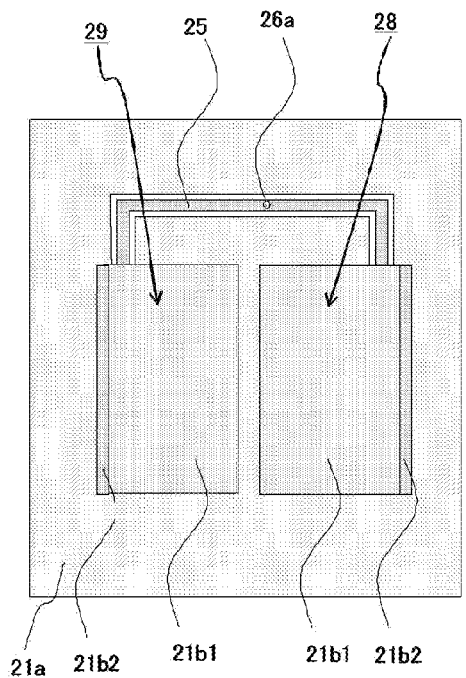
FIG. 6 is a plan view schematically illustrating a duplexer according to a second embodiment of the invention.
Figure 7:
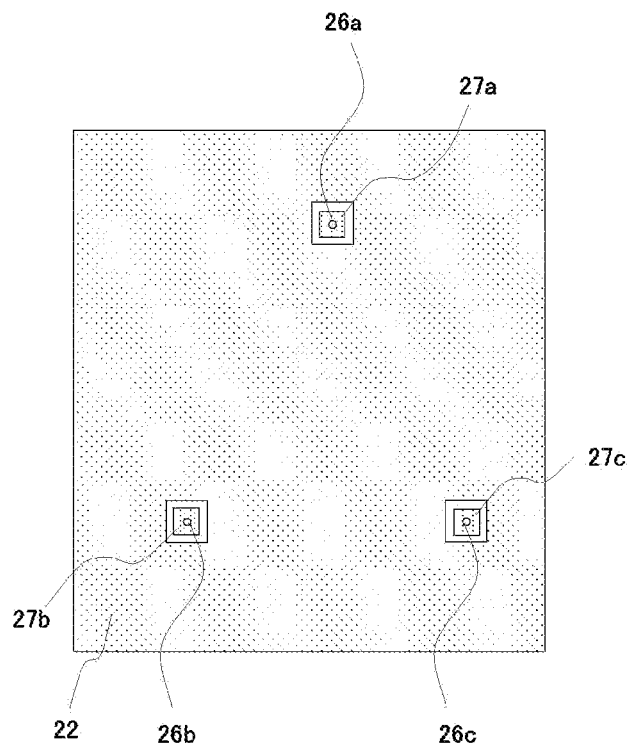
FIG. 7 is a plan view schematically illustrating a duplexer according to a second embodiment of the invention.

FIG. 5 is a sectional view schematically illustrating a duplexer according to a second embodiment of the invention. FIG. 6 is a plan view schematically illustrating the duplexer shown in FIG. 5 when seen in the +z direction. FIG. 7 is a plan view schematically illustrating the duplexer shown in FIG. 5 when seen in the −z direction. In FIG. 6, a conductor 24 in FIG. 5 is not shown. Further, in FIGS. 5 and 6, detailed structures of a transmitting filter 28 and a receiving filter 29 are not shown. In addition, in the present embodiment, different points from the above-described embodiment will be described. Further, the same reference numerals are given to the same components, and description thereof will be omitted.

The duplexer according to the present embodiment includes an antenna terminal 27a, a transmitting terminal 27b, a receiving terminal 27c, the transmitting filter 28, the receiving filter 29, a matched line 25, via conductors 26a, 26b, and 26c (via conductor 26a, via conductor 26b, and via conductor 26c), and the conductor 24. The transmitting filter 28 is connected in series between the antenna terminal 27a and the transmitting terminal 27b, and the receiving filter 29 is connected in series between the antenna terminal 27a and the receiving terminal 27c.

The transmitting filter 28 and the receiving filter 29 are the dielectric filters according to the first embodiment shown in FIGS. 1 to 4. The receiving filter 29 is disposed in a state of being rotated by 180° around the z-axis. Further, the transmitting filter 28 and the receiving filter 29 share the dielectric substrate 11, the outer conductor 21a, and the conductor 22. In addition, in each of the transmitting filter 28 and the receiving filter 29, the outer conductor 21b is configured by an outer conductor 21b1 having a through hole 23, and an outer conductor 21b2. Furthermore, each of the transmitting filter 28 and the receiving filter 29 does not include the via conductor 52a, the via conductor 52b, the external electrode 53a, and the external electrode 53b which are shown in FIG. 3.

The terminal electrode 51a of the transmitting filter 28 and the terminal electrode 51b of the receiving filter 29 are connected to the antenna terminal 27a through the matched line 25 and the via conductor 26a. The terminal electrode 51b of the transmitting filter 28 is connected to the transmitting terminal 27b through the via conductor 26b that passes through the dielectric substrate 11. The terminal electrode 51a of the receiving filter 29 is connected to the receiving terminal 27c through the via conductor 26c that passes through the dielectric substrate 11.

The matched line 25 is disposed on an upper surface of the dielectric substrate 11 at an interval from the outer conductor 21a, and electrically connects the antenna terminal 27a to the transmitting filter 28 and the receiving filter 29. The conductor 24 is disposed to surround the transmitting filter 28, the receiving filter 29, and the matched line 25 in cooperation with the conductor 22, and is connected to a reference potential to function as an electromagnetic shield.

In the duplexer according to the present embodiment, since the transmitting filter 28 and the receiving filter 29 are the dielectric filters according to the first embodiment, it is possible to obtain a duplexer with excellent electrical characteristics. If at least one of the transmitting filter 28 and the receiving filter 29 is the dielectric filter according to the first embodiment, it is possible to enhance the electrical characteristics of the duplexer.

Further, in the duplexer according to the present embodiment, both of the transmitting filter 28 and the receiving filter 29 are the dielectric filters according to the first embodiment, and the first side surfaces 30c of the respective dielectric blocks 30 are disposed to face each other. Thus, in the transmitting filter 28 and the receiving filter 29, the second conductors 62a to 62m for adjusting the electrostatic capacitances between adjacent inner conductors and the third conductors 63a to 63 for adjusting the electrostatic capacitances between the inner conductors 41a to 41g and the outer conductors 21a and 21b may be disposed outside the duplexer. Thus, for example, by removing the conductor 24, the outer conductors 21b1, and the outer conductors 21b2, it is possible to trim the second conductors 62a to 62m or the third conductors 63a to 63g in a state where the duplexer is configured. Thus, it is possible to obtain a duplexer capable of easily obtaining excellent electrical characteristics.

When one of the transmitting filter 28 and the receiving filter 29 is the dielectric filter according to the first embodiment, the first side surface 30c of the dielectric block 30 is disposed to face the other of the transmitting filter 28 and the receiving filter 29, and thus, it is possible to adjust the characteristics in a state where the duplexer is configured. In this case, the other of the transmitting filter 28 and the receiving filter 29 may be any type of filter, for example, a strip line filter or an SAW filter.

Further, in the duplexer according to the present embodiment, the outer conductor 21b is configured by the outer conductor 21b1 and the outer conductor 21b2. Further, the outer conductor 21b1 is a rectangular parallelepiped box-shaped conductor in which one surface is opened. The opening is directed toward the outer conductor 21a, and the outer conductor 21b1 is disposed on the first main surface of the outer conductor 21a to be connected to the outer conductor 21a so that the dielectric block 30 is accommodated therein. Further, the outer conductor 21b1 includes the through hole 23 formed in portions that face the second conductors 62a to 62m and the third conductors 63a to 63g so that the second conductors 62a to 62m and the third conductors 63a to 63g are exposed outside therethrough. Further, the outer conductors 21b2 may be attached to the outer conductor 21b1 to block the through hole 23, and has a detachable structure. Thus, for example, in a state where the outer conductor 21b1 is attached, it is possible to perform both of measurement of the electrical characteristics of the duplexer and trimming of the second conductors 62a to 62m or the third conductors 63a to 63g. Further, for example, by repeating measurement of the electrical characteristics in a state where the outer conductor 21b2 is attached and trimming of the second conductors 62a to 62m or the third conductors 63a to 63g in a state where the outer conductor 21b2 is detached, it is possible to easily perform fine adjustment of the electrical characteristics of the duplexer. Accordingly, it is possible to obtain a duplexer capable of easily realizing excellent electrical characteristics.

Third Embodiment

Figure 8:
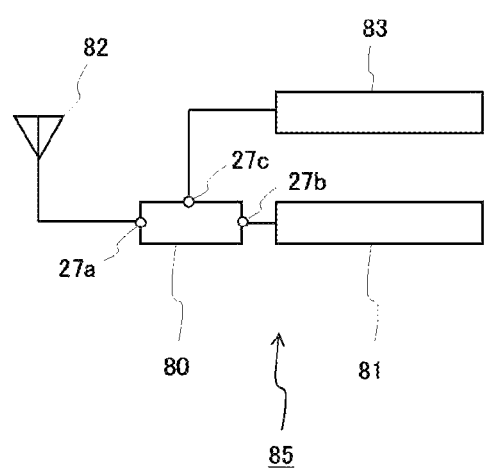
FIG. 8 is a block diagram schematically illustrating a communication device according to a third embodiment of the invention.

FIG. 8 is a block diagram schematically illustrating a communication device according to a third embodiment of the invention. The communication device according to the present embodiment includes at least a duplexer 80, an antenna 82, a transmitting circuit 81, and a receiving circuit 83.

The duplexer 80 is configured by the above-described duplexer according to the second embodiment. The antenna 82 is connected to the antenna terminal 27a of the duplexer 80, the transmitting circuit 81 is connected to the transmitting terminal 27b of the duplexer 80, and the receiving circuit 83 is connected to the receiving terminal 27c of the duplexer 80. The antenna 82 may be connected to the antenna terminal 27a through another circuit, the transmitting circuit 81 may be connected to the transmitting terminal 27b through another circuit, and the receiving circuit 83 may be connected to the receiving terminal 27c through another circuit.

Since the communication device according to the present embodiment with such a configuration performs communication using the duplexer according to the second embodiment with excellent electrical characteristics, it is possible to obtain a communication device with an excellent communication quality.

Modified Examples

The invention is not limited to the above-described embodiments, and various modifications and improvements may be made without departing from the scope of the invention.

In the above-described embodiments, an example in which the space between the dielectric block 30 and the outer conductor 21b is filled with air is shown, but the invention is not limited thereto. For example, the space between the dielectric block 30 and the outer conductor 21b may be in a vacuum state. Further, the space between the dielectric block 30 and the outer conductor 21b may be filled with a dielectric material (including gas) with a dielectric constant smaller than that of the dielectric block 30.

Further, in the above-described embodiments, an example in which the outer conductor 21b faces the second main surface 30b, the first side surface 30c, the second side surface 30d, the third side surface 30e, and the fourth side surface 30f of the dielectric block 30 at intervals is shown, but the invention is not limited thereto. For example, when the end portions of the inner conductors 41a to 41g on the second side surface 30d side are connected to the reference potential to function as a ¼ wavelength resonator, the outer conductor 21b may be in contact with the second side surface 30d of the dielectric block 30.

Further, in the dielectric filter of the above-described first embodiment, an example in which the protruding portion 33 is formed in the end portion of the dielectric block 30 on the second side surface 30d side is shown, but the invention is not limited thereto. The protruding portion 33 may not be provided as necessary.

Further, in the above-described embodiments, an example in which seven first through holes 31a to 31g and seven inner conductors 41a to 41g are provided is shown, but the invention is not limited thereto, and two or more first through holes and two more or inner conductors may be provided. Here, since increase in the number of resonators causes increase in size, the number is normally set to about 20 or less.

Examples

The electrical characteristics of the dielectric filter according to the first embodiment shown in FIGS. 1 to 4 were obtained by a simulation. In the simulation, a dielectric constituting the dielectric block 30 had a relative dielectric constant of 11 and a dielectric tangent of 0.00005. The conductivities of the variety of conductors and electrodes were set to $40 \times 10^6$ S/m. The dielectric block 30 was prepared to have a rectangular parallelepiped shape in which a distance from the first main surface 30a to the second main surface 30b was 12 mm, a distance from the first side surface 30c to the second side surface 30d was 19 mm, and a distance from the third side surface 30e to the fourth side surface 30f was 76 mm, and in which the protruding portion 33 was formed. The protruding portion 33 extended from the third side surface 30e to the fourth side surface 30f to be in contact with the first side surface 30c of the dielectric block 30, and had a rectangular parallelepiped shape having a length of 4 mm, a width of 76 mm, and a height of 5 mm. Each of the first through holes 31a to 31g was formed in a cylindrical shape having a diameter of 3 mm, and the center of each of the first through holes 31a to 31g was located at a distance of 6 mm from the first main surface 30a. The outer conductor 21a was formed in a rectangular shape having a length of 36 mm and a width of 95 mm, and the dielectric block 30 was located at the center thereof. The outer conductor 21b was configured in a rectangular parallelepiped box shape having a length of 26 mm, a width of 84 mm, and a height of 20 mm. Each of the second through holes 32a to 32f was configured in a cylindrical shape having a diameter of 3 mm, and the center thereof in the z-axis direction in the figures was located at a distance of 2 mm from the first main surface 30a.

Figure 9:
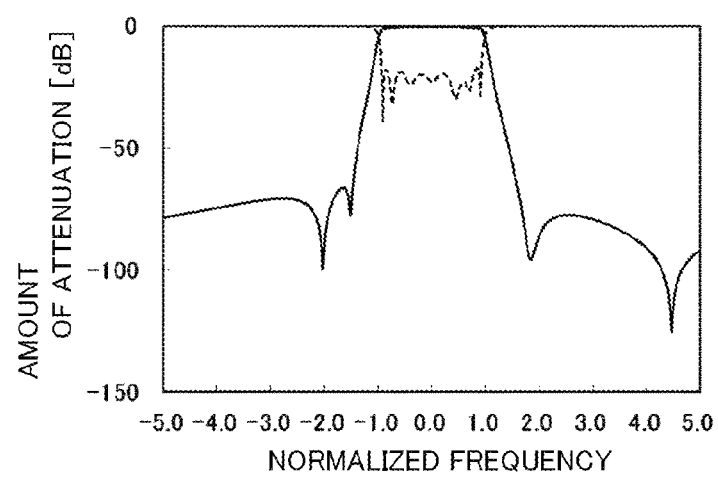
FIG. 9 is a graph illustrating a simulation result of an electrical characteristic of a dielectric filter according to the first embodiment of the invention.

A simulation result is shown in a graph of FIG. 9. A transverse axis in the graph represents a normalized frequency. When a normal frequency is represented as f, a center frequency of the filter is represented as $f_c$, and a bandwidth of the filter is represented as $f_b$, a normalized frequency $f_s$ is expressed as the following expression:

$$f_s = f_c/f_b \times (f/f_c - f_c/f).$$

Further, a longitudinal axis in the graph represents the amount of attenuation. Further, in the graph, a solid line represents a transmission characteristic, and a broken line represents a reflection characteristic. According to the graph, it can be understood that an excellent transmission characteristic with low loss and a large amount of attenuation around a passband is obtained. Thus, the effects of the invention were confirmed.

REFERENCE SIGNS LIST 21a, 21b: Outer conductor
27a: Antenna terminal
27b: Transmitting terminal
27c: Receiving terminal
28: Transmitting filter
29: Receiving filter
30: Dielectric block
30a: First main surface
30b: Second main surface
30c: First side surface
30d: Second side surface
30e: Third side surface
30f: Fourth side surface
31a-31g: First through hole
32a-32f: Second through hole
41a-41g: Inner conductor
61a-61f: First conductor
62a-62m: Second conductor
63a-63g: Third conductor
51a, 51b: Terminal electrode
80: Duplexer
81: Transmitting circuit
82: Antenna
83: Receiving circuit

The invention claimed is:
1. A dielectric filter, comprising:
a dielectric block having a rectangular parallelepiped shape, being provided with a plurality of first through holes and one or more second through holes;
a plurality of inner conductors disposed on inner surfaces of the first through holes, respectively, including a first inner conductor and a second inner conductor;
a first terminal electrode electrically or electromagnetically connected to the first inner conductor;
a second terminal electrode electrically or electromagnetically connected to the second inner conductor;
an outer conductor disposed to surround the dielectric block, being connected to a reference potential;
one or more first conductors disposed on a first side surface of the dielectric block; and
capacitance-coupling inner conductors which are not adjacent to each other among the inner conductors;
wherein:
the first through holes penetrating into the dielectric block in a first direction which is a direction from one of the first side surface and a second side surface of the dielectric block which face each other, toward the other thereof, and being arranged at intervals in a second direction which is a direction from one of a third side surface and a fourth side surface of the dielectric block which face each other, toward the other thereof,
the second through holes penetrating into the dielectric block in the first direction, and being located at a position between adjacent first through holes in the second direction,
the first inner conductor being disposed on an inner surface of a first through hole of the first through holes which is located at one end in the second direction, the second inner conductor being disposed on an inner surface of a first through hole of the first through holes which is located at the other end in the second direction, the outer conductor being disposed to be in contact with a first main surface of the dielectric block, and to face a second main surface, the third side surface, and the fourth side surface of the dielectric block at intervals, the first through holes being located on a second main surface side of the dielectric block, the second through holes being located on a first main surface side with reference to the first through holes, and the one or more first conductors are disposed on the second main surface side with reference to the inner conductors.

2. The dielectric filter according to claim 1, wherein a volume of a second through hole of the second through holes which is located at a center in the second direction is larger than volumes of second through holes of the second through holes which are located in opposite ends in the second direction.

3. The dielectric filter according to claim 2, wherein volumes of the second through holes gradually increase from the opposite ends toward the center in the second direction.

4. The dielectric filter according to claim 1, wherein a length in a direction from the first main surface toward the second main surface of an end on the first side surface side of the dielectric block is longer than a length in the direction from the first main surface toward the second main surface of the dielectric block except the end on the first side surface side of the dielectric block.

5. A duplexer, comprising at least:
an antenna terminal;
a transmitting terminal;
a receiving terminal;
a transmitting filter connected in series between the antenna terminal and the transmitting terminal; and
a receiving filter connected in series between the antenna terminal and the receiving terminal,
at least one of the transmitting filter and the receiving filter being the dielectric filter according to claim 1.

6. A duplexer, comprising at least:
an antenna terminal;
a transmitting terminal;
a receiving terminal;
a transmitting filter connected in series between the antenna terminal and the transmitting terminal; and
a receiving filter connected in series between the antenna terminal and the receiving terminal,
one of the transmitting filter and the receiving filter being the dielectric filter according to claim 1, the first side surface of the dielectric block being disposed to face the other of the transmitting filter and the receiving filter.

7. A duplexer, comprising at least:
an antenna terminal;
a transmitting terminal;
a receiving terminal;
a transmitting filter connected in series between the antenna terminal and the transmitting terminal; and
a receiving filter connected in series between the antenna terminal and the receiving terminal,
the transmitting filter and the receiving filter being the dielectric filter according to claim 1, the first side surface of the dielectric block of the transmitting filter and the receiving filter facing each other.

8. A communication device, comprising at least:
the duplexer according to claim 5;
an antenna connected to the antenna terminal in a direct manner or through another circuit;
a transmitting circuit connected to the transmitting terminal in a direct manner or through another circuit; and
a receiving circuit connected to the receiving terminal in a direct manner or through another circuit.

9. A dielectric filter comprising:
a dielectric block having a rectangular parallelepiped shape, being provided with a plurality of first through holes and one or more second through holes;
a plurality of inner conductors disposed on inner surfaces of the first through holes, respectively, including a first inner conductor and a second inner conductor;
a first terminal electrode electrically or electromagnetically connected to the first inner conductor;
a second terminal electrode electrically or electromagnetically connected to the second inner conductor;
an outer conductor disposed to surround the dielectric block, being connected to a reference potential; and
one or more second conductors disposed on a second side surface of the dielectric block,
the first through holes penetrating into the dielectric block in a first direction which is a direction from one of a first side surface and the second side surface of the dielectric block which face each other, toward the other thereof, and being arranged at intervals in a second direction which is a direction from one of a third side surface and a fourth side surface of the dielectric block which face each other, toward the other thereof,
the second through holes penetrating into the dielectric block in the first direction, and being located at a position between adjacent first through holes in the second direction,
the first inner conductor being disposed on an inner surface of a first through hole of the first through holes which is located at one end in the second direction,
the second inner conductor being disposed on an inner surface of a first through hole of the first through holes which is located at the other end in the second direction,
the outer conductor being disposed to be in contact with a first main surface of the dielectric block, and to face a second main surface, the third side surface, and the fourth side surface of the dielectric block at intervals,
the first through holes being located on a second main surface side of the dielectric block, the second through holes being located on a first main surface side with reference to the first through holes,
a length in a direction from the first main surface toward the second main surface of an end on the first side surface side of the dielectric block being longer than a length in the direction from the first main surface toward the second main surface of the dielectric block except the end on the first side surface side of the dielectric block, and
the one or more second conductors adjust electrostatic capacitance between the inner conductors which are adjacent to each other among the inner conductors.

10. A duplexer comprising:
an antenna terminal;
a transmitting terminal;
a receiving terminal;

a transmitting filter connected in series between the antenna terminal and the transmitting terminal; and
a receiving filter connected in series between the antenna terminal and the receiving terminal,
at least one of the transmitting filter and the receiving filter being the dielectric filter according to claim 9.

11. A duplexer comprising:
an antenna terminal;
a transmitting terminal;
a receiving terminal;
a transmitting filter connected in series between the antenna terminal and the transmitting terminal; and
a receiving filter connected in series between the antenna terminal and the receiving terminal,
one of the transmitting filter and the receiving filter being the dielectric filter according to claim 9, the first side surface of the dielectric block being disposed to face the other of the transmitting filter and the receiving filter.

12. A duplexer comprising:
an antenna terminal;
a transmitting terminal;
a receiving terminal;
a transmitting filter connected in series between the antenna terminal and the transmitting terminal; and
a receiving filter connected in series between the antenna terminal and the receiving terminal,
the transmitting filter and the receiving filter being the dielectric filter according to claim 9, the first side surface of the dielectric block of the transmitting filter and the receiving filter facing each other.

13. A communication device comprising:
the duplexer according to claim 10;
an antenna connected to the antenna terminal in a direct manner or through another circuit;
a transmitting circuit connected to the transmitting terminal in a direct manner or through another circuit; and
a receiving circuit connected to the receiving terminal in a direct manner or through another circuit.

14. A dielectric filter comprising:
a dielectric block having a rectangular parallelepiped shape, being provided with a plurality of first through holes and one or more second through holes;
a plurality of inner conductors disposed on inner surfaces of the first through holes, respectively, including a first inner conductor and a second inner conductor;
a first terminal electrode electrically or electromagnetically connected to the first inner conductor;
a second terminal electrode electrically or electromagnetically connected to the second inner conductor;
an outer conductor disposed to surround the dielectric block, being connected to a reference potential; and
one or more third conductors disposed on a second side surface of the dielectric block,
the first through holes penetrating into the dielectric block in a first direction which is a direction from one of a first side surface and the second side surface of the dielectric block which face each other, toward the other thereof, and being arranged at intervals in a second direction which is a direction from one of a third side surface and a fourth side surface of the dielectric block which face each other, toward the other thereof,
the second through holes penetrating into the dielectric block in the first direction, and being located at a position between adjacent first through holes in the second direction,
the first inner conductor being disposed on an inner surface of a first through hole of the first through holes which is located at one end in the second direction,
the second inner conductor being disposed on an inner surface of a first through hole of the first through holes which is located at the other end in the second direction,
the outer conductor being disposed to be in contact with a first main surface of the dielectric block, and to face a second main surface, the third side surface, and the fourth side surface of the dielectric block at intervals,
the first through holes being located on a second main surface side of the dielectric block, the second through holes being located on a first main surface side with reference to the first through holes,
a length in a direction from the first main surface toward the second main surface of an end on the first side surface side of the dielectric block being longer than a length in the direction from the first main surface toward the second main surface of the dielectric block except the end on the first side surface side of the dielectric block, and
the one or more third conductors adjust electrostatic capacitance between the inner conductors and the outer conductor.

15. A duplexer comprising:
an antenna terminal;
a transmitting terminal;
a receiving terminal;
a transmitting filter connected in series between the antenna terminal and the transmitting terminal; and
a receiving filter connected in series between the antenna terminal and the receiving terminal,
at least one of the transmitting filter and the receiving filter being the dielectric filter according to claim 14.

16. A duplexer comprising:
an antenna terminal;
a transmitting terminal;
a receiving terminal;
a transmitting filter connected in series between the antenna terminal and the transmitting terminal; and
a receiving filter connected in series between the antenna terminal and the receiving terminal,
one of the transmitting filter and the receiving filter being the dielectric filter according to claim 14, the first side surface of the dielectric block being disposed to face the other of the transmitting filter and the receiving filter.

17. A duplexer comprising:
an antenna terminal;
a transmitting terminal;
a receiving terminal;
a transmitting filter connected in series between the antenna terminal and the transmitting terminal; and
a receiving filter connected in series between the antenna terminal and the receiving terminal,
the transmitting filter and the receiving filter being the dielectric filter according to claim 14, the first side surface of the dielectric block of the transmitting filter and the receiving filter facing each other.

18. A communication device comprising:
the duplexer according to claim 15;
an antenna connected to the antenna terminal in a direct manner or through another circuit;
a transmitting circuit connected to the transmitting terminal in a direct manner or through another circuit; and a receiving circuit connected to the receiving terminal in a direct manner or through another circuit.

\* \* \* \* \*